United States Patent [19]

Hitomi

[11] Patent Number: 4,717,892
[45] Date of Patent: Jan. 5, 1988

[54] CURRENT-CONTROLLED MULTIVIBRATOR WITH TEMPERATURE COMPENSATION

[75] Inventor: Hisakazu Hitomi, Yokohama, Japan
[73] Assignee: Kabushiki Kaisha Toshiba, Kawasaki, Japan
[21] Appl. No.: 910,987
[22] Filed: Sep. 24, 1986

[30] Foreign Application Priority Data

Sep. 25, 1985 [JP] Japan .................. 60-211406

[51] Int. Cl.⁴ ............................................. H03K 3/283
[52] U.S. Cl. .................................. 331/113 R; 331/176; 332/14
[58] Field of Search .................. 331/113 R, 111, 144, 331/176; 332/14

[56] References Cited

U.S. PATENT DOCUMENTS

| | | | |
|---|---|---|---|
| 4,007,426 | 2/1977 | Utsunomiya | 331/113 R X |
| 4,492,914 | 1/1985 | Hitomi | 323/313 |
| 4,600,897 | 7/1986 | Koga et al. | 331/113 R |

FOREIGN PATENT DOCUMENTS 59-22434  2/1984  Japan .

*Primary Examiner*—Siegfried H. Grimm
*Attorney, Agent, or Firm*—Cushman, Darby & Cushman

[57] ABSTRACT

An emitter-coupled astable multivibrator capable of reducing a temperature drift of an oscillation frequency to zero is disclosed. The multivibrator includes first and second transistors, the emitters and collectors of which are cross-coupled, and which are turned ON and OFF at given intervals in accordance with the control current; a capacitor, connected between the emitters of the first and second transistors, to be charged and discharged, the charging polarity of the capacitor being alternately inverted upon the turning ON/OFF of the first and second transistors; third and fourth transistors, the bases of which are commonly connected to a power source circuit, and the emitters of which are respectively connected to the collectors of the first and second transistors; and a fifth transistor, the base of which is connected to the power source circuit to have a predetermined potential difference from the base potentials of the third and fourth transistors, and the emitter of which is connected to the collectors of the first and second transistors through first and second resistors, respectively. The emitter current density of the fifth transistor is different from that of the third or fourth transistor to compensate for the temperature drift.

8 Claims, 9 Drawing Figures

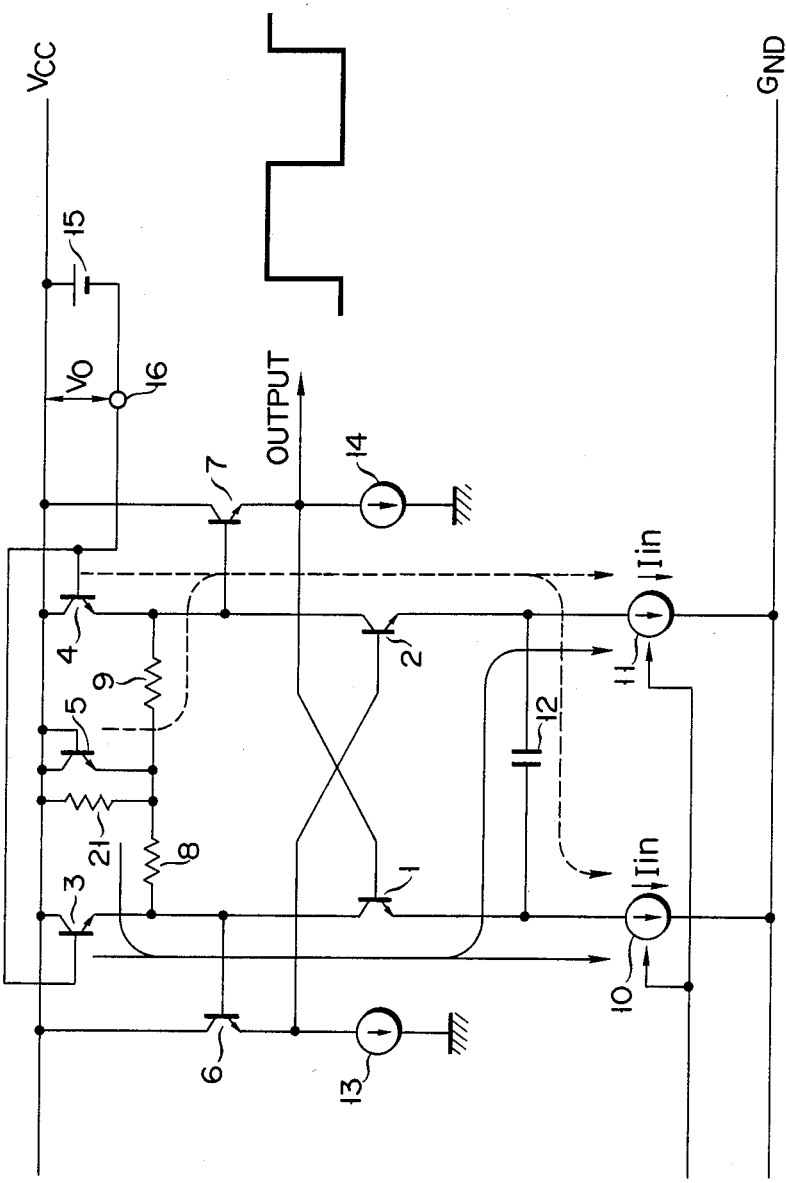
F I G. 5

CURRENT-CONTROLLED MULTIVIBRATOR WITH TEMPERATURE COMPENSATION

BACKGROUND OF THE INVENTION

The present invention relates to a current-controlled oscillator suitable for constituting an FM modulator. More particularly, the present invention relates to a current-controlled multivibrator which compensates for effects due to temperature.

FIG. 1 is a circuit diagram of a current-controlled oscillator of a conventional emitter-coupled astable multivibrator, which is equivalent to that disclosed in Japanese Patent Disclosure No. 59-22434.

Referring to FIG. 1, the collectors of a pair of transistors 1 and 2 are connected to the emitters of transistors 3 and 4, respectively. The collectors of transistors 1 and 2 are also connected to the emitter of transistor 5 respectively through resistors 8 and 9. The collector of transistor 1 is connected to the base of transistor 2 through the base-emitter path of transistor 6, and the collector of transistor 2 is connected to the base of transistor 1 through the base-emitter path of transistor 7.

The bases of transistors 3 and 4 are connected to voltage source 15 constituting a bias circuit, and the collectors thereof are connected to power source voltage Vcc. The emitter of transistor 6 is connected to the base of transistor 2, as described above. However, it is also branched to be grounded through current source 13. Similarly, the emitter of transistor 7 is branched to be grounded through current source 14. The emitters of transistors 1 and 2 are connected to each other through capacitor 12 and are also grounded respectively through control current sources 10 and 11.

The operation of the current-controlled oscillator with the above arrangement will now be described with reference to the timing charts shown in FIGS. 2A to 2D. In the following description, changes over time in collector potentials VC1 and VC2 and emitter potentials VE1 and VE2 of transistors 1 and 2 will be explained.

The operation of the current-controlled oscillator is performed by repeating alternate ON/OFF inversions of transistors 1 and 2. Assume that transistor 1 is turned on and transistor 2 is turned off at time t1. At this time, since transistor 3 is turned on, collector potential VC1 of transistor 1 is lower than base-emitter voltage VBE3 of transistor 3. Assuming that a potential difference between output terminal 16 and the base of transistor 5 is VO, the potential of output terminal 16 is VCC-VO, and collector potential VC1 of transistor 1 at time t1 is given by:

$$VC1 = VCC - VO - VBE3 (t = t1) \quad (1)$$

Collector potential VC2 of transistor 2 is lower than power source voltage VCC by base-emitter voltage VBE5 of transistor 5 since transistor 4 is turned off, and can be expressed by:

$$VC2 = VCC - VBE5 (t = t1) \quad (2)$$

Emitter potentials VE1 and VE2 of transistors 1 and 2 at time t1 are now considered. If the base-emitter voltage of transistor 7 is given by VBE7, and the base-emitter voltage of ON transistor 1 is given by VBE1, emitter potential VE1 is given by:

$$VE1 = VCC - VBE5 - VBE7 - VBE1(t = t1) \quad (3)$$

At this time, as indicated by a solid arrow in FIG. 1, input current Iin flows through capacitor 12.

Capacitor 12 is charged at a constant rate in a polarity indicated by the solid arrow, and emitter potential VE2 of transistor 2 is then decreased at a constant rate after time t1, as shown in FIG. 2D. When emitter potential VE2 is decreased and base-emitter voltage VBE2 of transistor 2 reaches a certain value, transistor 2 is inverted from OFF to ON. If the value of base-emitter voltage VBE2 causing this inversion is given by VBE2(ON) and the time of inversion is t2, emitter potential VE2 of transistor 2 at time t2 is expressed by:

$$VE2 = VB2 - VBE2(ON)(t = t2) \quad (4)$$

In this case, VB2 is the base potential of transistor 2. Since VB2 is lower than collector potential VC1 of transistor 1 by base-emitter voltage VBE6 of transistor 6, VB2 is expressed by:

$$VB2 = VC1 - VBE6 \quad (5)$$
$$= VCC - VO - VBE3 - VBE6$$

As a result, this yields:

$$VE2 = VCC - VO - VBE3 - VBE6 - VBE2(ON)(t = t2) \quad (6)$$

When transistor 2 is inverted from OFF to ON, transistor 1 is inverted from ON to OFF. Therefore, collector potential VC1 of transistor 1 is given by:

$$VC1 = VCC - VBE5(t = t2) \quad (7)$$

Collector potential VC2 of transistor 2 is given by:

$$VC2 = VCC - VO - VBE4(t = t2) \quad (8)$$

Similar to emitter potential VE1 of transistor 1 at time t1, emitter potential VE2 of transistor 2, which is turned on at time t2, is expressed by the following relation:

$$VE2 = VCC - VBE5 - VBE6 - VBE2(t = t2) \quad (9)$$

where VBE2 is the base-emitter voltage of ON transistor 2.

At time t2, emitter potential VE2 of transistor 2 increases from a value given by:

$$VCC - VO - VBE3 - VBE6 - VBE2(ON) \quad (10)$$

to a value given by:

$$VCC - VBE5 - VBE6 - VBE2 \quad (11)$$

by a value given by:

$$VO + VBE3 - VBE5 + VBE2(ON) - VBE2 \quad (12)$$

If resistor 8 is selected to equalize currents flowing through the collectors of transistor 3 and 5 when transistor 3 is kept ON, base-emitter voltages VBE3 and VE5 of transistors 3 and 5 are equal to each other.

An increment of emitter potential VE2 of transistor 2 at time t2 is given by:

If $$VBE3 = VBE5 \quad (14)$$

then, the increment is:

$$VO + VBE2(ON) - VBE2 \quad (15)$$

Emitter potential VE1 of transistor 1 at time t2 is higher than a potential given by the following relation by the above increment:

$$VCC - VBE5 - VBE7 - VBE1 \quad (16)$$

and is expressed by:

$$VE1 = VCC - VBE5 - VBE7 - VBE1 + VO + VBE2\text{-}(ON) - VBE2(t=t2) \quad (17)$$

After time t2, when transistor 1 is turned off and transistor 2 is turned on, since input current Iin flows in the direction indicated by a broken arrow in FIG. 1, emitter potential VE1 of transistor 1 then decreases at a constant rate, as shown in FIG. 2C. If the base-emitter voltage necessary for turning transistor 1 from OFF to ON is given by VBE1(ON), transistor 1 is turned on again, and transistor 1 is turned off at a time (time t3) when potential VE1 is:

$$VE1 = VCC - VO - VBE4 - VBE7 - VBE1(ON) \quad (18)$$

Emitter potential VE1 of transistor 1 which is turned on is recovered to a value given by:

$$VE1 = VCC - VBE5 - VBE7 - VBE1(t=t3) \quad (19)$$

and, an increment at time t3 is:

$$VO + VBE4 - VBE5 + VBE1(ON) - VBE1 \quad (20)$$

If the resistance of resistor 9 is selected to equalize base-emitter voltages VBE4 and VBE5 of transistors 4 and 5, the increment of VE1 at time t3 is:

$$VO + VBE1(ON) + VBE1 \quad (21)$$

Thereby, emitter potential VE2 of transistor 2 at time t3 is higher than that before time t3 given below by the above increment:

$$VCC - VBE5 - VBE6 - VBE2 \quad (22)$$

and is:

$$VE2 = VCC - VBE5 - VBE6 - VBE2 + VO + VBE\text{-}1(ON) \quad (23)$$

Thereafter, ON/OFF inversion of transistors 1 and 2 is repeated, collector potential VC1 of transistor 1 or collector potential VC2 of transistor 2 has a pulse-like waveform repeated at constant interval 2T, as shown in FIGS. 2A and 2B, and the oscillation output of the current-controlled oscillator is obtained. In this case, in accordance with a change in interval T of collector potential VC1 of transistor 1, the terminal voltage of capacitor 12 changes within interval T from a value given by:

$$VCC - VO - VBE4 - VBE7 - VBE1(ON) \quad (24)$$

to a value given by:

$$VCC - VBE5 - VBE7 - VBE1 + VO + VBE2\text{-}(ON) - VBE2 \quad (25)$$

by a value given by:

$$2VO + VBE1(ON) - VBE1 + VBE2(ON) - VBE2 \quad (26)$$

If the arrangement of transistors 1 and 2 is selected to be symmetrical, since $$VBE1 = VBE2, \; VBE1(ON) = VBE2(ON) \quad (27)$$

a change in voltage applied to capacitor 12 is:

$$2(VO + VBE1(ON) - VBE1) \quad (28)$$

Therefore, if the capacitance of capacitor 12 is given by C, the following relation is established:

$$C \cdot 2(VO + VBE1(ON) - VBE1) = Iin \cdot T \quad (29)$$

Thus, oscillation frequency f0 of the current-controlled oscillator can be expressed by:

$$f0 = \tfrac{1}{2}T = Iin/4CVC \quad (30)$$

where VC is the terminal voltage of capacitor 12 when the ON/OFF states of transistors 1 and 2 are inverted, and is given by:

$$VC = VO + VBE2(ON) - VBE1 \quad (31)$$

As can be seen from relation (30), when input current Iin is carried, oscillation frequency f0 changes. Therefore, when a video signal, for example, is used as an input signal and constant current Iin is changed by the input signal, the current-controlled oscillator shown in FIG. 1 can be used as an FM modulator for a VCR (Video Cassette Recorder).

Oscillation frequency f0 of the emitter-coupled astable multivibrator has a temperature drift, however, as will be explained below.

Temperature drift of oscillation frequency f0 is attributed to temperature drift of terminal voltage VC represented by relation (31). More specifically, at time t2 when transistor 2 is inverted from OFF to ON, the collector currents of transistors 1 and 2 are not equal to each other in practice. For this reason, a difference between temperature coefficients of base-emitter voltages VBE1 and VBE2(ON) of transistors 1 and 2 occurs, thus causing temperature drift of terminal voltage VC.

In order to understand this in more detail, collector current IC2(ON) flowing through transistor 2 will be considered.

Assuming that emitter potential VE2 is decreased by ΔV and transistor 2 in the OFF state is about to be turned on before time t2, at this time, a current flowing through resistor 9 is increased by ΔV·gm2 if the transconductance of transistor 2 is given by gm2. Collector current VC2 of transistor 2 is thereby decreased by ΔV·gm2·R9. A change in collector potential VC2 is positively fed back to the emitter of transistor 2 itself sequentially through the base-emitter paths of transistors 7 and 1 and capacitor 12.

A condition for inverting transistor 2 from OFF to ON is that loop gain G, given by the following relation, is more than 1:

$$G = \Delta V \cdot gm2 \cdot R9 / \Delta V = gm2 \cdot R9 \quad (32)$$

Therefore, at an instant when $G=1$ (time t2), transistor 2 is inverted from OFF to ON. The collector current at this instant is IC2(ON), and transconductance gm2 is expressed by:

$$gm2 = (q/KT) \cdot IC2(ON) \quad (33)$$

Where K is the Boltzmann's constant, T is the absolute temperature, and q is the unit charge. From $G=1$ and relations (32) and (33), upon inversion of transistor 2, the collector current of transistor 2 is expressed by:

$$IC2(ON) = KT/q \cdot R9 \quad (34)$$

Since collector current IC2(ON) is obtained as described above, if a saturated current of transistors 1 and 2 is given by IS, base-emitter voltage VBE2(ON) upon inversion of transistor 2 is expressed by:

$$VBE2(ON) = (KT/q) \cdot \ln(IC2(ON)/IS) \quad (35)$$
$$= (KT/q) \cdot \ln(KT/IS \, qR9)$$

Since collector current IC1 of transistor 1 is substantially equal to Iin, base-emitter voltage VBE1 upon inversion of transistor 1 is expressed by:

$$VBE1 = (KT/q) \cdot \ln(Iin/IS) \quad (36)$$

Therefore, from relations (35), (36), and (31), terminal voltage VC of capacitor 12 upon inversion is given by:

$$VC = VO - (KT/q) \cdot \ln(qR9 \, 2Iin/KT) \quad (37)$$

As can be seen from the above relation, terminal voltage VC is a function of temperature T and has a negative temperature drift. Therefore, oscillation frequency f0 expressed by relation (30) has a positive temperature drift.

SUMMARY OF THE INVENTION

It is an object of the present invention to provide a current-controlled oscillator which can eliminate the above-mentioned temperature drift of oscillation frequency.

According to the present invention, there is provided a current-controlled oscillator comprising a control current source for changing a control current; first and second transistors, the emitters and collectors of which are cross-coupled, and which are turned on and off at given intervals in accordance with the control current; a capacitor, connected between the emitters of the first and second transistors, the polarity of which is alternately inverted upon the turning on/off of the first and second transistors to be charged and discharged; third and fourth transistors, the emitters of which are respectively connected to the collectors of the first and second transistors; a fifth transistor, the base of which is connected to a power source circuit to have a predetermined potential difference from the base potentials of the third and fourth transistors; and first and second impedance elements connected between the emitter of the fifth transistor and the emitters of the third and fourth transistors, respectively. The fifth transistor has a different emitter current density from that of the third or fourth transistors.

According to the present invention, since the current density of the fifth transistor is set to be different from that of the third or fourth transistors, the temperature drift of the current-controlled oscillator, capable of a low-voltage operation, can be eliminated with almost no increase in the number of elements required.

BRIEF DESCRIPTION OF THE DRAWINGS

FIG. 5 is a circuit diagram showing a modification of the oscillator shown in FIG. 4.

DESCRIPTION OF THE PREFERRED EMBODIMENTS

Figure 3:
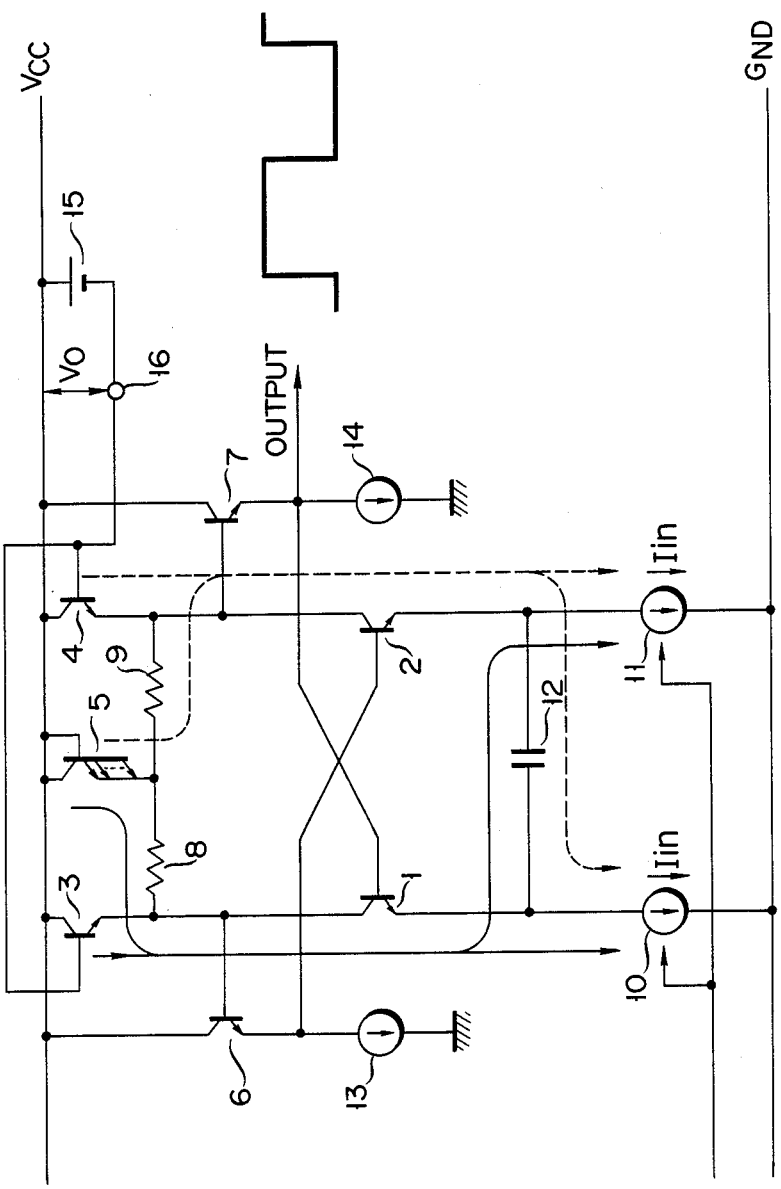
FIG. 3 is a circuit diagram of a current-controlled oscillator according to an embodiment of the present invention.

A current-controlled oscillator according to an embodiment of the present invention will be described hereinafter with reference to FIG. 3. The same reference numerals in FIG. 3 denote the same parts as in FIG. 1 for the sake of simplicity. As is apparent from a comparison of FIGS. 1 and 3, the difference between the current-controlled oscillators shown in FIGS. 1 and 3 is as follows.

Figure 1:
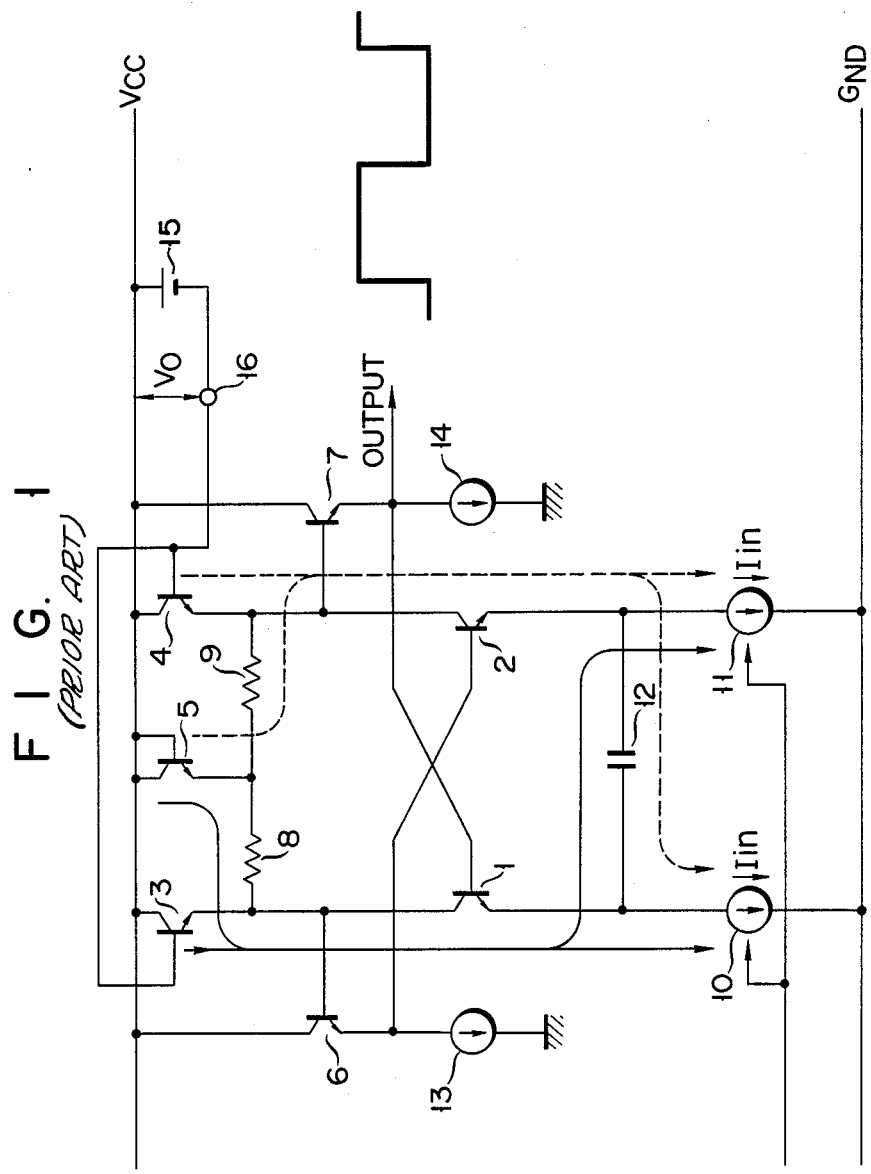
FIG. 1 is a circuit diagram of a conventional current-controlled oscillator.
Figure 2:
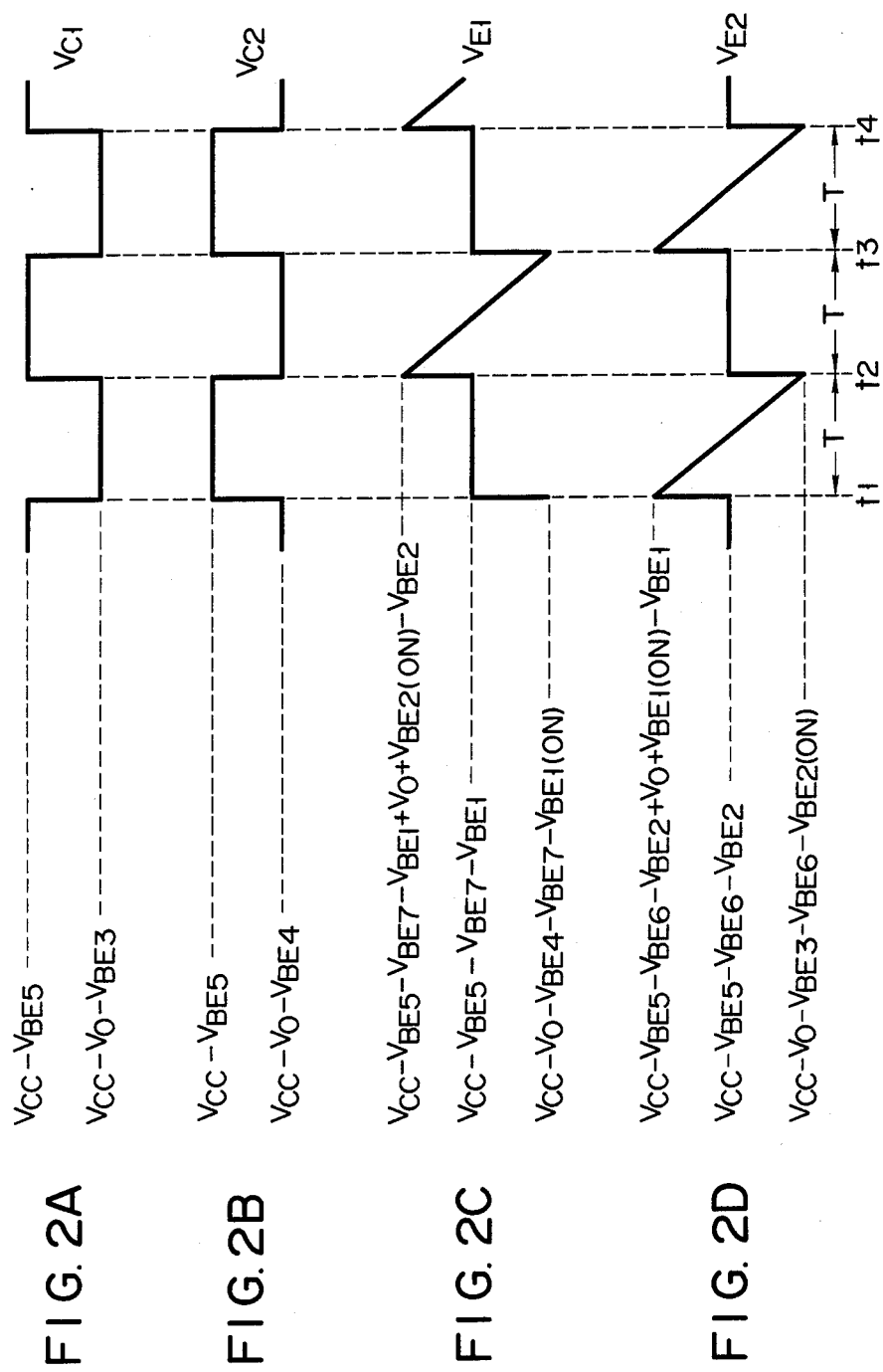
FIGS. 2A to 2D are timing charts for explaining the operation of the oscillator shown in FIG. 1.

In FIG. 1, since currents flowing through transistors 5 and 3 are equal to each other and emitter areas of transistors 3 and 4 are also equal to each other, as described above, their current densities are equal to each other, and VBE5 is equal to VBE3 or VBE4. In contrast to this, in FIG. 3 the emitter area of transistor 5 is n times that of transistor 3 or 4 so that the current density of transistor 5 is different from that of transistor 3 or 4. For this reason, if VC is calculated using relations (12) and (20) instead of relations (15) and (21), it is expressed by:

$$VC = VO + VBE3 - VBE5 + VBE2(ON) - VBE1 \quad (38)$$

If the emitter areas of transistors 3 and 5 are set at a ratio of 1:n, saturated currents thereof are at a ratio of Is:nIs. If currents flowing through transistor 3 and resistor 8 or 9 are set to be equal to each other, base-emitter voltages VBE3 and VBE5 are expressed by:

$$VBE3 = (KT/q) \cdot \ln(Iin/Is) \quad (39)$$

$$VBE5 = (KT/q) \cdot \ln(Iin/nIs) \quad (40)$$

Thus, from relations (35), (36), (38), (39), and (40), VC can be expressed by:

$$VC = VO - (KT/q) \cdot \ln(1/n \, qR9 \, 2Iin/KT) \quad (41)$$

Therefore, $$(1/n) \cdot qR9 \cdot 2Iin/KT = 1 \quad (42)$$

That is, if n is selected to yield:

$$n = 2qR9 \cdot Iin/KT \quad (43)$$

Since relation (41) would become VC=VO, if VO is stabilized against temperature, the temperature drift of VC can be reduced to zero. In other words, the temperature drift of oscillation frequency f0 can be compensated for.

Note that the emitter areas of transistors 5, 3, and 4 can be set to be the same, and the impurity concentration of the emitter region of transistor 5 can be set to be different from that of transistor 3 or 4 so that the temperature drift is reduced to zero, i.e., the temperature drift of oscillation frequency f0 can be compensated for.

Figure 4:
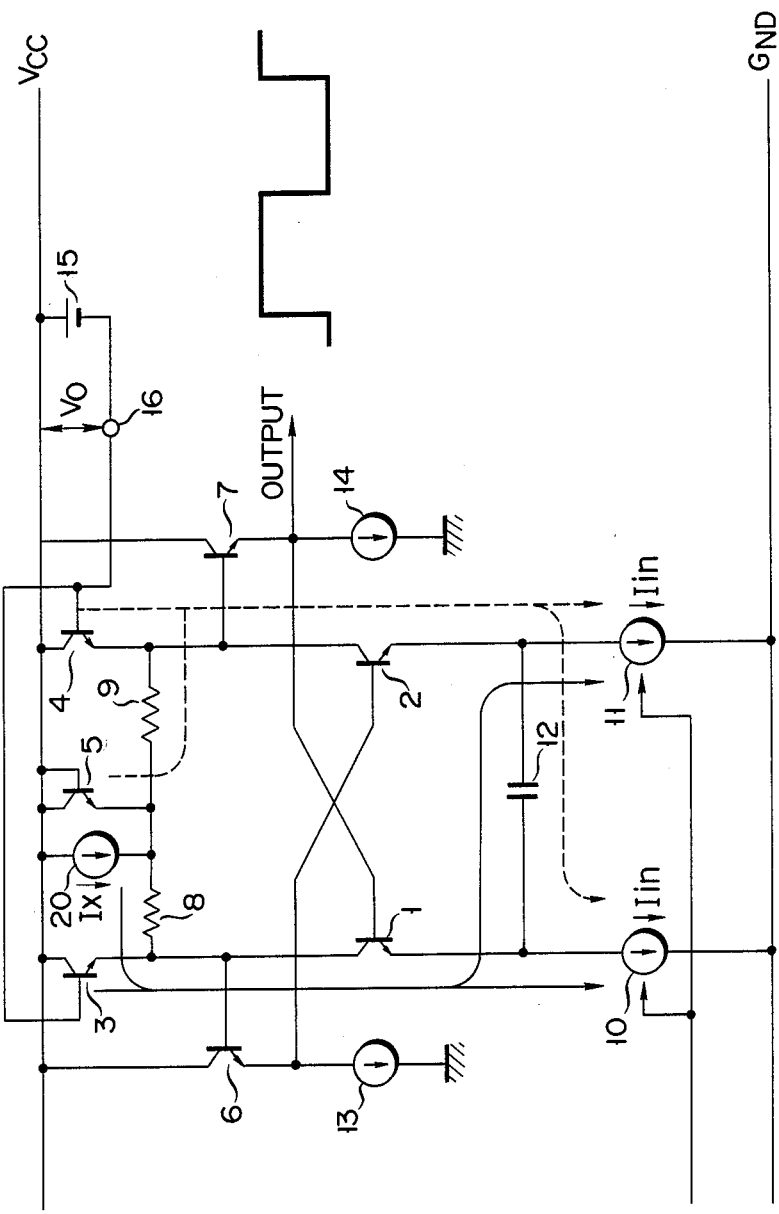
FIG. 4 is a circuit diagram of a current-controlled oscillator according to another embodiment of the present invention.

Another embodiment of the present invention will now be described with reference to FIG. 4. The difference between the current-controlled oscillators shown in FIGS. 4 and 1 is that constant current source 20 is connected between voltage source 15 and the emitter of transistor 5 in FIG. 4.

The collector current of transistor 5 is decreased so that the current densities of transistor 5 and transistors 3 or 4 are different from each other. Assuming that currents flowing through transistor 3 and resistor 8 are set to be equal to each other in the ON state of transistor 1, if the sum of emitter current IE3 of transistor 3 and current IR3 flowing through resistor 8 is 2Iin, this yields IE3=IR3=Iin. At this time, if a current flowing through constant current source 20 is given by Ix, the base-emitter voltages of transistors 3 and 5 are respectively given by:

$$VBE3 = (KT/q) \cdot \ln Iin/Is \quad (44)$$

$$VBE5 = (KT/q) \cdot \ln (Iin - Ix)/Is \quad (45)$$

Thus, from relations (35), (36), (38), (39), and (40), VC can be expressed by:

$$VC = VO - (KT/q) \cdot \ln (Iin - Ix/Iin) \cdot (qR9 \cdot 2Iin/KT)) \quad (46)$$

This yields:

$$((Iin - Ix)/Iin) \cdot (qR9 \cdot 2Iin/KT) = 1 \quad (47)$$

That is, if Ix is selected to satisfy the following relation, VC will equal VO, and the temperature drift of VC can be reduced to zero:

$$Ix = Iin - KT/2qR9 \quad (48)$$

In other words, the temperature drift of oscillation frequency f0 can be compensated for.

A detailed embodiment of the present invention will be described below with reference to FIGS. 5 and 6. In the embodiment of the present invention shown in FIG. 4, constant current source 20 can be realized by, e.g., simple arrangements shown in FIGS. 5 and 6.

In FIG. 5, both ends of resistor 21 are connected to voltage source 15 and the emitter of transistor 5 to constitute the constant current source. In this circuit, current Ix of the constant current source can be expressed by:

$$Ix = VBE5/R21 \quad (49)$$

Figure 6:
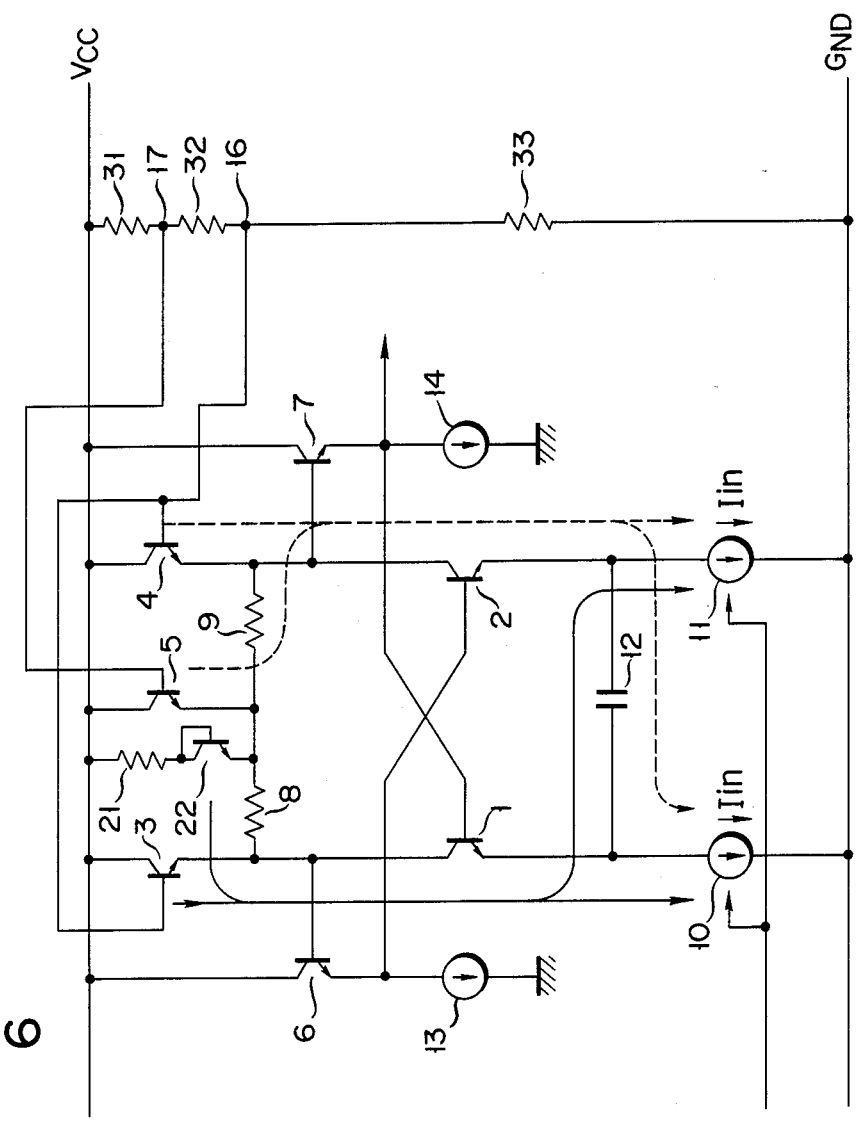
FIG. 6 is a circuit diagram showing another modification of the oscillator shown in FIG. 4.

FIG. 6 shows another arrangement of the constant current source. Assume that a bias circuit is constituted by resistors 31, 32, and 33 which are series-connected between power source VCC and ground GND. The base of transistor 5 is connected to node 17 between resistors 31 and 32, and the base of transistor 4 is connected to node 16 between resistors 32 and 33. The constant current source is constituted such that a series circuit of resistor 21 and diode-connected transistor 22 is connected between power source VCC and the emitter of transistor 5.

In this circuit, if the resistances of resistors 31 to 33 are given by R31 to R33, a voltage applied across the two ends of resistor 21 is given by:

$$(R31/(R31+R32+R33)) \cdot VCC + VBE5 - VBE22$$

Therefore, Ix can be expressed by:

$$Ix = (1/R21) \cdot ((R31/R31+R32+R33) \cdot VCC + VBE5 - VBE22) \quad (50)$$

Even if base-emitter voltages VBE5 and VBE22 of transistors 5 and 22 are varied by a given level, variations in base-emitter voltages VBE5 and VBE22 of transistors 5 and 22 are canceled by the term VBE5−VBE22 in relation (50). In particular, if this circuit is constituted by an IC circuit, current Ix flowing through the constant current source can be kept constant.

The disclosure of U.S. Pat. No. 4,492,914 (filing date: July 22, 1983, inventor: Hisakazu Hitomi) is incorporated in this specification by reference.

Note that even if resistors 8 and 9 shown in FIGS. 3, 4, 5, and 6 have different resistances, the temperature drift can be reduced to zero. Also, diodes can be used in place of resistors 8 and 9. Furthermore, the embodiments shown in FIGS. 3 to 6 can be combined.

What is claimed is:

1. A current-controlled multivibrator with temperature compensation, comprising:
    a control current source for changing a control current;
    first and second transistors, the emitters of which are coupled to said control current source, the bases and collectors of which are cross-coupled, and which are turned on and off at given intervals in accordance with said control current;
    a capacitor, connected between the emitters of said first and second transistors, to be charged and discharged such that the charging polarity of said capacitor is alternately inverted upon the turning ON/OFF of said first and second transistors;
    third and fourth transistors, the emitters of which are respectively connected to the collectors of said first and second transistors, the bases of which are connected to a voltage source constituting a bias circuit, and the collectors of which are connected to a power source circuit to have a predetermined potential difference from the base potentials of said third and fourth transistors;
    a fifth transistor, the base and the collector of which are connected to the power source circuit and having an emitter current density different from that of at least one of said third and fourth transistors; and
    first and second impedance elements connected between the emitter of said fifth transistor and the emitters of said third and fourth transistors, respectively.

2. A multivibrator according to claim 1, wherein said first and second impedance elements respectively include first and second resistors.

3. A current-controlled multivibrator with temperature compensation, including:

a control current source for changing a control current;

first and second transistors, the emitters of which are coupled to said control current source, the bases and collectors of which are cross-coupled, and which are turned ON and OFF at given intervals in accordance with said control current;

a capacitor, connected between the emitters of said first and second transistors, to be charged and discharged such that the charging polarity of said capacitor is alternately inverted upon the turning ON/OFF of said first and second transistors;

third and fourth transistors, the emitters of which are respectively connected to the collectors of said first and second transistors, the bases of which are connected to a voltage source constituting a bias circuit, and the collectors of which are connected to a power source circuit to have a predetermined potential difference from the base potentials of said third and fourth transistors;

a fifth transistor, the base and the collector of which are connected to the power source circuit;

first and second impedance elements connected between the emitter of said fifth transistor and the emitters of said third and fourth transistors, respectively; and a constant current source connected between the emitter of said fifth transistor and said power source circuit.

4. A multivibrator according to claim 3, wherein said constant current source includes a resistor.

5. A multivibrator according to claim 4, wherein said constant current source includes a resistor and a diode-connected transistor.

6. A multivibrator according to claim 1, wherein a value of n is selected to satisfy a relation $n = 2qR9\, Iin/KT$ to reduce a temperature drift of an oscillation frequency to substantially zero, where n indicates a ratio of emitter areas of said third or fourth transistor and said fifth transistor; q, a unit charge; R9, a resistance of a resistor connected between the emitters of said third and fifth transistors or the emitters of said fourth and fifth transistors; Iin, an input current which flows through said capacitor; K, a Boltzmann's constant; and T, an absolute temperature.

7. A multivibrator according to claim 3, wherein a value of n is selected to satisfy a relation $n = 2qR9\, Iin/KT$ to reduce a temperature drift of an oscillation frequency to substantially zero, where n indicates a ratio of emitter areas of said third or fourth transistor and said fifth transistor; q, a unit charge; R9, a resistance of a resistor connected between the emitters of said third and fifth transistors or the emitters of said fourth and fifth transistors; Iin, an input current which flows through said capacitor; K, a Boltzmann's constant; and T, an absolute temperature.

8. A multivibrator according to claim 3, wherein a value of Ix is selected to yield $Ix = Iin - KT/2qR9$ to compensate for a temperature drift of an oscillation frequency, where Ix indicates a current flowing through said constant current source; Iin, an input current which flows through said capacitor; K, a Boltzmann's constant; q, a unit charge; and R9, a resistance of a resistor connected between the emitters of said third and fifth transistors such that a current flowing through said third transistor matches a current flowing through said resistor.

* * * * *